(12) United States Patent
Adachi (10) Patent No.: US 10,262,797 B2
(45) Date of Patent: Apr. 16, 2019

(54) MULTILAYER BODY AND ELECTRONIC COMPONENT

(71) Applicant: Murata Manufacturing Co., Ltd., Nagaokakyo-shi, Kyoto-fu (JP)

(72) Inventor: Hiroshige Adachi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/879,469

(22) Filed: Jan. 25, 2018

(65) Prior Publication Data

US 2018/0166216 A1    Jun. 14, 2018

Related U.S. Application Data

(63) Continuation of application No. PCT/JP2016/085724, filed on Dec. 1, 2016.

(30) Foreign Application Priority Data

Jan. 12, 2016    (JP) .................................. 2016-003590

(51) Int. Cl.
   *H02H 1/04*        (2006.01)
   *H01G 4/12*        (2006.01)
   (Continued)

(52) U.S. Cl.
   CPC ............. *H01G 4/129* (2013.01); *B22F 7/008* (2013.01); *B22F 7/02* (2013.01); *B32B 9/00* (2013.01);
   (Continued)

(58) Field of Classification Search
   USPC ....................................................... 361/119
   See application file for complete search history.

(56) References Cited

U.S. PATENT DOCUMENTS 8,455,381 B2 *   6/2013   Sugimoto ............... C03C 3/064
                                                        361/321.4
9,881,743 B2 *   1/2018   Adachi ............... H01F 27/2804
                          (Continued)

FOREIGN PATENT DOCUMENTS

JP        64-061015 A     3/1989
JP      2006-278602 A    10/2006
                (Continued)

OTHER PUBLICATIONS

Official Communication issued in International Patent Application No. PCT/JP2016/085724, dated Feb. 28, 2017.

*Primary Examiner* — Ronald W Leja (74) *Attorney, Agent, or Firm* — Keating & Bennett, LLP (57) ABSTRACT

A multilayer body includes a multilayer structure including a glass ceramic layer including a glass and a filler and a ferrite layer including a ferrite, in which the glass ceramic layer has a glass content of about 30.0% or more by weight and about 80.0% or less by weight and a filler content of about 20.0% or more by weight and about 70.0% or less by weight, the glass included in the glass ceramic layer includes about 0.5% or more by weight and about 5.0% or less by weight $R_2O$ (R represents at least one selected from the group consisting of Li, Na, and K), about 0% or more by weight and about 5.0% or less by weight $Al_2O_3$, about 10.0% or more by weight and about 25.0% or less by weight $B_2O_3$, and about 70.0% or more by weight and about 85.0% or less by weight $SiO_2$ based on the total weight of the glass, and the filler included in the glass ceramic layer includes at least one of $SiO_2$ and $Al_2O_3$ and also includes about 5.0% or more by weight and about 15.0% or less by weight of a ferrite based on the total weight of the glass and the filler.

20 Claims, 5 Drawing Sheets

(51) Int. Cl.
  *B32B 9/00* (2006.01)
  *C03C 3/089* (2006.01)
  *C03C 3/091* (2006.01)
  *C04B 35/16* (2006.01)
  *H01G 4/40* (2006.01)
  *H05K 1/16* (2006.01)
  *H05K 3/46* (2006.01)
  *B22F 7/00* (2006.01)
  *B32B 15/18* (2006.01)
  *B32B 17/06* (2006.01)
  *H01F 27/24* (2006.01)
  *H01F 27/28* (2006.01)
  *H01F 27/40* (2006.01)
  *H01G 4/30* (2006.01)
  *H03H 1/00* (2006.01)
  *H01F 17/00* (2006.01)
  *H01F 27/32* (2006.01)
  *B22F 7/02* (2006.01)

(52) U.S. Cl.
  CPC ............ *B32B 15/18* (2013.01); *B32B 17/061* (2013.01); *C03C 3/089* (2013.01); *C03C 3/091* (2013.01); *C04B 35/16* (2013.01); *H01F 17/0013* (2013.01); *H01F 27/24* (2013.01); *H01F 27/2804* (2013.01); *H01F 27/32* (2013.01); *H01F 27/40* (2013.01); *H01G 4/30* (2013.01); *H01G 4/40* (2013.01); *H03H 1/00* (2013.01); *H05K 1/16* (2013.01); *H05K 3/46* (2013.01); *B22F 2301/35* (2013.01); *B32B 2315/02* (2013.01); *B32B 2457/16* (2013.01); *H01F 2017/0066* (2013.01); *H01F 2027/2809* (2013.01); *H03H 2001/0085* (2013.01)

(56) References Cited

U.S. PATENT DOCUMENTS

| | | | | |
|---|---|---|---|---|
| 2010/0271163 | A1* | 10/2010 | Nakamura | B32B 18/00 336/200 |
| 2011/0027559 | A1* | 2/2011 | Kirby | C04B 35/16 428/215 |
| 2011/0037557 | A1* | 2/2011 | Konoue | H01F 17/0013 336/200 |
| 2011/0181384 | A1* | 7/2011 | Inuduka | C03C 14/004 336/234 |
| 2012/0217615 | A1* | 8/2012 | Tatekawa | C03C 3/087 257/532 |
| 2014/0340812 | A1* | 11/2014 | Sumi | H01T 1/20 361/220 |
| 2015/0061816 | A1* | 3/2015 | Kang | H01F 27/24 336/212 |
| 2015/0294780 | A1* | 10/2015 | Maeda | H01F 17/0013 336/200 |
| 2016/0254096 | A1* | 9/2016 | Adachi | H01F 27/2804 361/321.4 |
| 2017/0345543 | A1* | 11/2017 | Soda | H01F 3/08 |
| 2018/0166216 | A1* | 6/2018 | Adachi | B22F 7/02 |

FOREIGN PATENT DOCUMENTS

JP    2012-080046 A    4/2012
WO    2015/093098 A1   6/2015

* cited by examiner

SUBSTRATE FOR EVALUATING OPACITY

CO-SINTERED BODY FOR EVALUATING DELAMINATION

FIG. 8

MULTILAYER BODY AND ELECTRONIC COMPONENT

CROSS REFERENCE TO RELATED APPLICATIONS

This application claims the benefit of priority to Japanese Patent Application No. 2016-003590 filed on Jan. 12, 2016 and is a Continuation Application of PCT Application No. PCT/JP2016/085724 filed on Dec. 1, 2016. The entire contents of each application are hereby incorporated herein by reference.

BACKGROUND OF THE INVENTION

1. Field of the Invention

The present invention relates to a multilayer body and an electronic component.

2. Description of the Related Art

With the miniaturization of electronic apparatuses, various electronic components incorporated in electronic apparatuses are also required to have a smaller size and a lower profile. It has recently been reported that, for example, LC filters are formed by forming high-permeability ferrite layers in ceramic substrates and burying coil conductors in the ferrite layers.

Japanese Unexamined Patent Application Publication No. 2012-80046 discloses a glass ceramic substrate in which a ferrite layer including ferrite crystals, an insulating layer including a glass ceramic that includes a first crystal having the same crystal structure as the ferrite crystals, and an intermediate layer that is arranged between the insulating layer and the ferrite layer and that includes the glass ceramic including the first crystal and the ferrite crystals are stacked. The glass ceramic substrate described in Japanese Unexamined Patent Application Publication No. 2012-80046 is characterized in that some of the ferrite crystals in the intermediate layer protrude toward the insulating layer.

In a multilayer body in which an insulating layer including a glass ceramic and a ferrite layer are laminated, the high difference in thermal expansion coefficient between both causes a problem, such as the occurrence of defects, for example, delamination, cracking, and warping to arise during co-sintering. In the structure described in Japanese Unexamined Patent Application Publication No. 2012-80046, the arrangement of the intermediate layer between the glass ceramic layer and the ferrite layer reduces the problem, such as delamination due to the difference in coefficient of linear expansion. However, it is necessary to arrange the intermediate layer that does not have an electromagnetic function as a dielectric or magnetic material. Thus, a low profile is difficult to achieve, as compared to the case in which no intermediate layer is provided.

The glass ceramic layer is made of a high-$SiO_2$-content glass and thus has transparency. In the case in which the glass ceramic layer is arranged on a surface layer, an inner layer electrode arranged in the glass ceramic layer is seen from a surface. Thus, for example, a difficulty arises in determining whether an electrode formed by plating on the surface layer adheres satisfactorily or not.

SUMMARY OF THE INVENTION

Preferred embodiments of the present invention provide multilayer bodies in each of which a glass ceramic layer having a low relative dielectric constant and high insulation resistance and a ferrite layer are laminated, the multilayer bodies being capable of preventing the occurrence of, for example, delamination at an interface and a decrease in insulation resistance without providing an intermediate layer between the glass ceramic layer and the ferrite layer, the glass ceramic layer having low transparency.

A multilayer body according to a preferred embodiment of the present invention includes a multilayer structure including a glass ceramic layer that includes a glass and a filler and a ferrite layer that includes a ferrite, in which the glass ceramic layer has a glass content of about 30.0% or more by weight and about 80.0% or less by weight and a filler content of about 20.0% or more by weight and about 70.0% or less by weight, the glass included in the glass ceramic layer includes about 0.5% or more by weight and about 5.0% or less by weight $R_2O$ (R represents at least one selected from the group consisting of Li, Na, and K), about 0% or more by weight and about 5.0% or less by weight $Al_2O_3$, about 10.0% or more by weight and about 25.0% or less by weight $B_2O_3$, and about 70.0% or more by weight and about 85.0% or less by weight $SiO_2$ based on the total weight of the glass, and the filler included in the glass ceramic layer includes at least one of $SiO_2$ and $Al_2O_3$ and also includes about 5.0% or more by weight and about 15.0% or less by weight of a ferrite based on the total weight of the glass and the filler.

In a multilayer body according to a preferred embodiment of the present invention, the amount of the ferrite to the extent that the relative dielectric constant of the glass ceramic layer is able to be maintained at a low level is included in the glass ceramic layer. This reduces the difference in shrinkage behavior between the glass ceramic layer and the ferrite layer. Thus, the occurrence of, for example, delamination at the interface is able to be prevented without providing an intermediate layer.

At least one of $SiO_2$ and $Al_2O_3$ and the ferrite are included in the glass ceramic layer, thus preventing a decrease in the insulation resistance of the co-sintered body including the glass ceramic layer and the ferrite layer.

This is presumably because of a reduction in the interdiffusion between the glass ceramic layer and the ferrite layer. In the case in which at least one of $SiO_2$ and $Al_2O_3$ and the ferrite are included in the glass ceramic layer, certain amounts of $SiO_2$ and $Al_2O_3$, which are fillers, react with a glass component during firing and are incorporated into a glass composition, so as to increase the viscosity of the glass. Thus, the glass component is less likely to diffuse into the ferrite layer. The incorporation of the ferrite in the glass ceramic layer reduces the concentration gradient of a ferrite component between the glass ceramic layer and the ferrite layer, so that the diffusion of the ferrite component into the glass ceramic layer is less likely to occur. This seemingly results in the co-sintered body having good insulation resistance characteristics.

In a multilayer body according to a preferred embodiment of the present invention, the ferrite included in the glass ceramic layer defines and functions as a denitrifying material and, thus, reduces the transparency of the glass ceramic layer. Accordingly, an inner electrode located in the glass ceramic layer cannot be seen from a surface. This facilitates a determination of whether an electrode formed by plating on the surface layer adheres satisfactorily or not.

In a multilayer body according to a preferred embodiment of the present invention, the ferrite included in the glass ceramic layer preferably has the same composition as the ferrite included in the ferrite layer.

In the case in which the ferrite included in the glass ceramic layer has the same composition as the ferrite included in the ferrite layer, the effect of reducing the difference in shrinkage behavior between the glass ceramic layer and the ferrite layer and the effect of reducing the interdiffusion between the glass ceramic layer and the ferrite layer are sufficiently provided.

In a multilayer body according to a preferred embodiment of the present invention, each of the ferrite included in the glass ceramic layer and the ferrite included in the ferrite layer is preferably a Ni—Zn-based ferrite.

Among ferromagnetic ferrites having a spinel structure, Ni—Zn-based ferrites have sufficiently high permeability in high frequencies and, thus, are suitable for high-frequency applications.

In a multilayer body according to a preferred embodiment of the present invention, the multilayer body may be a multilayer ceramic substrate or a chip component.

An electronic component according to a preferred embodiment of the present invention includes a multilayer body according to a preferred embodiment of the present invention.

According to preferred embodiments of the present invention, it is possible to provide multilayer bodies in which the glass ceramic layer having a low relative dielectric constant and high insulation resistance and a ferrite layer are laminated, the multilayer bodies being capable of preventing the occurrence of, for example, delamination at an interface and a decrease in insulation resistance without providing an intermediate layer between the glass ceramic layer and the ferrite layer, the glass ceramic layer having low transparency.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 4A to 4C are schematic diagrams of a dielectric capacitor produced in each of examples of preferred embodiments of the present invention and comparative examples.

FIGS. 5A to 5C are schematic diagrams of a co-sintered capacitor produced in each of the examples of preferred embodiments of the present invention and the comparative examples.

FIGS. 6A and 6B are schematic diagrams of a substrate for evaluating opacity, the substrate being produced in each of the examples of preferred embodiments of the present invention and the comparative examples.

DETAILED DESCRIPTION OF THE PREFERRED EMBODIMENTS

Multilayer bodies and electronic components according to preferred embodiments of the present invention will be described below.

However, the present invention is not limited to the following structures. Various modifications may be appropriately made as long as the gist of the present invention is not changed.

Preferred embodiments described below are illustrative, and structures indicated in different preferred embodiments may be partially replaced or combined.

A combination of two or more of individual preferred embodiments of the present invention described below is also included in the present invention.

Figure 1:
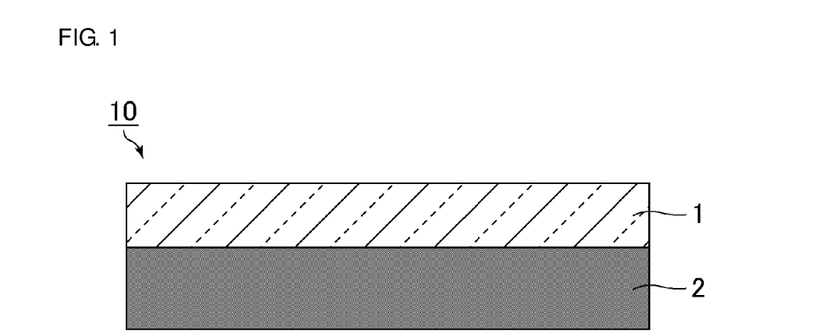
FIG. 1 is a schematic cross-sectional view of an example of a multilayer body according to a preferred embodiment of the present invention.

FIG. 1 is a schematic cross-sectional view of an example of a preferred embodiment of a multilayer body of the present invention.

A multilayer body 10 illustrated in FIG. 1 includes a multilayer structure including a glass ceramic layer 1 that includes a glass and a filler and a ferrite layer 2 that includes a ferrite. An intermediate layer is not provided between the glass ceramic layer 1 and the ferrite layer 2. The glass ceramic layer 1 is in contact with the ferrite layer 2. The multilayer body 10 is preferably a co-sintered body formed by co-sintering the glass ceramic layer 1 and the ferrite layer 2, for example.

In FIG. 1, each of the glass ceramic layer 1 and the ferrite layer 2 is illustrated as a single layer. However, each of the layers may preferably have a multilayer structure including a plurality of layers.

The ferrite included in the ferrite layer is preferably a ferromagnetic ferrite including a solid solution having a spinel structure. Examples thereof include Ni—Zn-based ferrites (also including Ni—Zn—Cu-based ferrites), Mn—Zn-based ferrites, Mg—Zn-based ferrites, and Ni—Co-based ferrites. These ferrites may be included alone or in a combination of two or more. Among ferromagnetic ferrites having a spinel structure, Ni—Zn-based ferrites are preferred, and Ni—Zn—Cu-based ferrites are more preferred because of their sufficiently high permeability in high frequencies.

The ferrite layer may include a filler other than the ferrite. The ferrite layer preferably has a ferrite content of about 95.0% or more by weight, more preferably about 100% by weight, for example.

The glass included in the glass ceramic layer preferably includes, for example, about 0.5% or more by weight and about 5.0% or less by weight $R_2O$ (R represents at least one selected from the group consisting of Li, Na, and K), about 0% or more by weight and about 5.0% or less by weight $Al_2O_3$, about 10.0% or more by weight and about 25.0% or less by weight $B_2O_3$, and about 70.0% or more by weight and about 85.0% or less by weight $SiO_2$ based on the total weight of the glass. $Al_2O_3$ is an optional component.

The glass included in the glass ceramic layer may further include impurities. When impurities are included, the content of the impurities is preferably less than about 5.0% by weight, for example.

The glass ceramic layer preferably has a glass content, of, for example, about 30.0% or more by weight and about 80.0% or less by weight, more preferably about 45.0% or more by weight and about 65.0% or less by weight.

The filler included in the glass ceramic layer preferably includes at least one of $SiO_2$ and $Al_2O_3$, for example. An example of $SiO_2$ is quartz.

In this specification, the filler refers to an inorganic additive that is not included in the glass.

The glass ceramic layer preferably has a filler content of, for example, about 20.0% or more by weight and about 70.0% or less by weight, more preferably about 35.0% or more by weight and about 55.0% or less by weight.

The $SiO_2$ content is preferably, for example, about 5.0% or more by weight and about 60.0% or less by weight, more preferably about 20.0% or more by weight and about 40.0% or less by weight based on the total weight of the glass and the filler. The $Al_2O_3$ content is preferably about 0.5% or more by weight and about 10.0% or less by weight based on the total weight of the glass and the filler.

The filler included in the glass ceramic layer further includes a ferrite. The ferrite included in the glass ceramic layer is preferably a ferromagnetic ferrite including a solid solution having a spinel structure. Examples thereof include Ni—Zn-based ferrites (including Ni—Zn—Cu-based ferrites), Mn—Zn-based ferrites, Mg—Zn-based ferrites, and Ni—Co-based ferrites. These ferrites may be included alone or in a combination of two or more.

The ferrite included in the glass ceramic layer may have a different composition from the ferrite included in the ferrite layer and preferably has the same composition as the ferrite included in the ferrite layer. In particular, each of the ferrite included in the glass ceramic layer and the ferrite included in the ferrite layer is preferably a Ni—Zn-based ferrite, more preferably a Ni—Zn—Cu-based ferrite, for example.

The ferrite content is preferably about 5.0% or more by weight and about 15.0% or less by weight, more preferably about 8.0% or more by weight and about 12.0% or less by weight based on the total weight of the glass and the filler, for example.

The glass ceramic layer may include a filler (such as $ZrO_2$) other than $SiO_2$, $Al_2O_3$, or the ferrite.

In the vicinity of the interface between the glass ceramic layer and the ferrite layer (i.e., regions extending from the interface to positions about 1 μm from the interface) of the multilayer body according to the present preferred embodiment, their components are diffused because of the junction. Thus, when the compositions of the glass ceramic layer and the ferrite layer are measured, the compositions are measured not in portions in the vicinity of the interface between the glass ceramic layer and the ferrite layer, but in portions remote from the interface.

To produce the multilayer body 10 illustrated in FIG. 1, glass ceramic sheets for the glass ceramic layer 1 and ferrite sheets for the ferrite layer 2 are prepared.

The glass ceramic sheets are preferably formed by forming a slurry including a glass powder, a filler powder, an organic binder, and a solvent into sheets by, for example, a doctor blade method. The ferrite sheets are formed by forming a slurry including a ferrite powder, an organic binder, and a solvent into sheets by, for example, a doctor blade method. These slurries may include various additives, such as a plasticizer, for example.

A predetermined number of the glass ceramic sheets and a predetermined number of the ferrite sheets are stacked and fired to provide the multilayer body 10.

A multilayer body according to a preferred embodiment of the present invention may be used for a multilayer ceramic substrate, for example.

Figure 2:
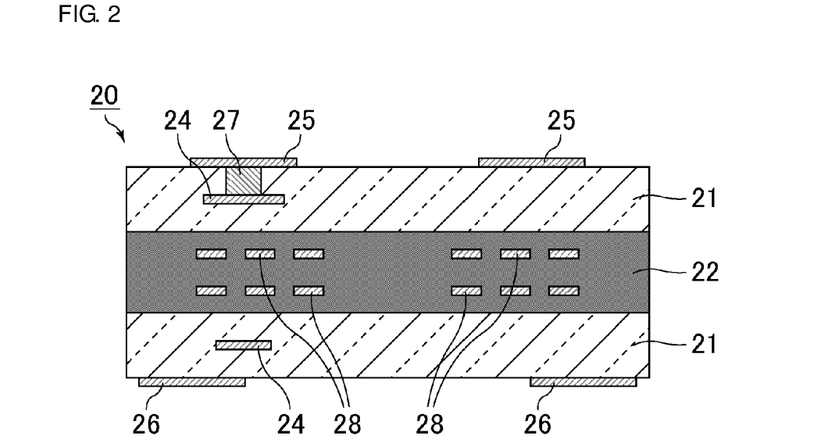
FIG. 2 is a schematic cross-sectional view of an example of a multilayer ceramic substrate according to a preferred embodiment of the present invention.

FIG. 2 is a schematic cross-sectional view of an example of a multilayer ceramic substrate according to a preferred embodiment of the present invention.

A multilayer ceramic substrate 20 illustrated in FIG. 2 including a multilayer structure including a ferrite layer 22 and two glass ceramic layers 21 that sandwich the ferrite layer 22 in the thickness direction.

The multilayer ceramic substrate 20 includes conductive leads provided in or on the glass ceramic layers 21. The conductive leads are used to define passive elements, such as capacitors and inductors or to establish connections, such as electrical connections between elements. As illustrated in FIG. 2, the conductive leads include some conductive films 24, 25, and 26 and some via-hole conductors 27. Preferably, these conductive leads are primarily made of silver or copper.

The conductive films 24 are provided in or on the glass ceramic layers 21. The conductive films 25 and 26 are provided on one main surface and the other main surface, respectively, of the multilayer ceramic substrate 20. The via-hole conductors 27 are electrically connected to any of the conductive films 24, 25, and 26 and so as to extend through the glass ceramic layers 21 in the thickness direction.

The multilayer ceramic substrate 20 further includes a coil conductor 28 provided in the ferrite layer 22. Preferably, the coil conductor 28 is primarily made of silver or copper.

FIG. 2 illustrates an example in which two triple-wound planar coil conductors are vertically arranged to define the coil conductor 28.

A chip component (not illustrated) is mounted on the one main surface of the multilayer ceramic substrate 20 while being electrically connected to the conductive films 25, resulting in an electronic component including the multilayer ceramic substrate 20. The chip component mounted on the multilayer ceramic substrate 20 may be a multilayer body according to a preferred embodiment of the present invention.

The conductive films 26 provided on the other main surface of the multilayer ceramic substrate 20 are used as electrical connecting members when the electronic component is mounted on a motherboard (not illustrated).

The multilayer ceramic substrate may be produced by forming a conductive lead pattern to be formed into the conductive leads on the glass ceramic sheet and forming a coil conductor pattern to be formed into the coil conductor on the ferrite sheet in a method for producing the multilayer body. The multilayer ceramic substrate 20 illustrated in FIG. 2 may be produced, for example, as follows: a predetermined number of the glass ceramic sheets including the conductive leads are arranged on the upper and lower surfaces of a predetermined number of the ferrite sheets including the coil conductor pattern to form a multilayer sheet body, followed by firing the multilayer sheet body.

The conductive lead pattern and the coil conductor pattern are preferably formed by applying a conductive paste including a powder of metal, such as silver or copper, an organic binder, and a solvent into a predetermined pattern using, for example, a screen printing method. The conductive paste may include various additives, such as a dispersant, for example.

The firing temperature at which the multilayer sheet body is fired is not particularly limited. For example, a firing temperature of about 1,000° C. or lower may preferably be used. The firing atmosphere is not particularly limited. For example, when a material such as silver, which is not easily oxidized, is used as a conductive material, the firing is preferably performed in an air atmosphere. When a material such as copper, which is easily oxidized, is used, the firing is preferably performed in a low-oxygen atmosphere, such as a nitrogen atmosphere, for example.

A multilayer body according to a preferred embodiment of the present invention may be used for a chip component, in addition to the foregoing multilayer ceramic substrate.

Figure 3:
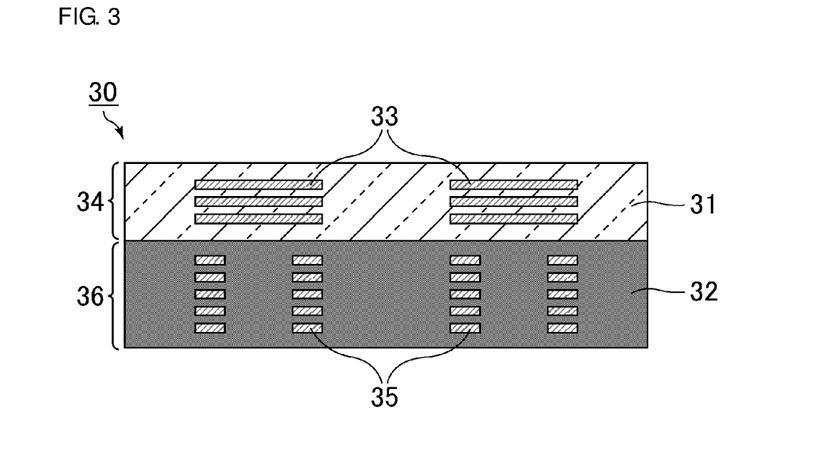
FIG. 3 is a schematic cross-sectional view of an example of an LC filter defined by a chip component according to a preferred embodiment of the present invention.

FIG. 3 is a schematic cross-sectional view of an example of an LC filter defining a chip component according to a preferred embodiment of the present invention.

An LC filter 30 illustrated in FIG. 3 has a multilayer structure including a glass ceramic layer 31 and a ferrite layer 32.

Capacitor electrodes 33 are arranged in the glass ceramic layer 31 so as to face each other, thus defining a capacitor 34. A coil conductor 35 extending in the shape of a coil is provided in the ferrite layer 32, thus defining an inductor 36.

The LC filter 30 further includes connecting conductors that connect the capacitor 34 to the inductor 36, terminal electrodes defining input-output terminals, and a terminal electrode defining a ground terminal, which are not illustrated in FIG. 3. Of these, the terminal electrodes defining the input-output terminals and the terminal electrode defining the ground terminal are provided on the outer surface of the LC filter 30.

Examples of a chip component for which the multilayer body according to the present preferred embodiment may be used include capacitors and inductors in addition to LC composite components, such as LC filters, for example.

A multilayer body according to a preferred embodiment of the present invention may be used to define a component other than the multilayer ceramic substrate or the chip component.

The structures of multilayer bodies according to preferred embodiments of the present invention are not particularly limited as long as they have the multilayer structure including the glass ceramic layer and the ferrite layer.

In the multilayer ceramic substrate 20 illustrated in FIG. 2, the ferrite layer 22 is arranged between the two glass ceramic layers 21. However, the multilayer body may have a structure in which a glass ceramic layer is arranged between two ferrite layers. The number of layers stacked is not particularly limited. Any of the glass ceramic layer and the ferrite layer may be arranged on a surface of the multilayer body.

Examples that more specifically disclose multilayer bodies according to preferred embodiments of the present invention will be described below. The present invention is not limited to these examples only.

Oxides or carbonates as starting materials were mixed together such that glass compositions listed in Table 1 were satisfied. Each of the resulting mixtures was placed in a Pt crucible and melted for about 3 hours at about 1,400° C. or higher and about 1,600° C. or lower, depending on the glass composition. The resulting molten glasses were quenched and pulverized to provide glass powders for samples. Each of the glass powders was mixed with a corresponding one of filler powders, listed in Table 1, including an alumina powder, a quartz powder, and a calcined Ni—Zn—Cu-based ferrite powder in proportions listed in Table 1. To the resulting mixtures, a solvent, a binder, and a plasticizer were added. The mixtures were sufficiently stirred to provide slurries. Here, as the solvent, a mixed solution of ethanol and toluene was used. As the binder, a butyral resin was used. As the plasticizer, phthalate was used. The resulting slurries were formed by a doctor blade method into glass ceramic sheets.

In Table 1, the proportions by weight of alumina, quartz, and the ferrite as a filler are expressed as the proportions by weight based on the total weight of the glass and the filler.

TABLE 1

| | Glass | | | | | Filler | | | |
|---|---|---|---|---|---|---|---|---|---|
| | Composition (based on 100 of total weight of glass) | | | | | | | | Total |
| Sample No. | $K_2O$ [% by weight] | $Al_2O_3$ [% by weight] | $B_2O_3$ [% by weight] | $SiO_2$ [% by weight] | Content [% by weight] | Alumina [% by weight] | Quartz [% by weight] | Ferrite [% by weight] | content [% by weight] |
| 1 | 0.5 | 0 | 20.0 | 79.5 | 65.0 | 5.0 | 20.0 | 10.0 | 35.0 |
| 2 | 5.0 | 0 | 20.0 | 75.0 | 50.0 | 5.0 | 35.0 | 10.0 | 50.0 |
| 3 | 2.0 | 0 | 20.0 | 78.0 | 55.0 | 5.0 | 30.0 | 10.0 | 45.0 |
| 4 | 2.0 | 5.0 | 20.0 | 73.0 | 55.0 | 5.0 | 30.0 | 10.0 | 45.0 |
| 5 | 3.0 | 3.0 | 10.0 | 84.0 | 65.0 | 5.0 | 20.0 | 10.0 | 35.0 |
| 6 | 2.0 | 0 | 25.0 | 73.0 | 50.0 | 5.0 | 35.0 | 10.0 | 50.0 |
| 7 | 3.0 | 2.0 | 25.0 | 70.0 | 50.0 | 5.0 | 35.0 | 10.0 | 50.0 |
| 8 | 2.0 | 0 | 13.0 | 85.0 | 65.0 | 5.0 | 20.0 | 10.0 | 35.0 |
| 9 | 2.0 | 0 | 20.0 | 78.0 | 50.0 | 10.0 | 30.0 | 10.0 | 50.0 |
| 10 | 2.0 | 0 | 20.0 | 78.0 | 55.0 | 1.0 | 34.0 | 10.0 | 45.0 |
| 11 | 3.0 | 0 | 22.0 | 75.0 | 30.0 | 5.0 | 55.0 | 10.0 | 70.0 |
| 12 | 2.0 | 0 | 18.0 | 80.0 | 80.0 | 5.0 | 5.0 | 10.0 | 20.0 |
| 13 | 2.0 | 0 | 20.0 | 78.0 | 55.0 | 5.0 | 30.0 | 10.0 | 45.0 |
| 14 | 2.0 | 0 | 20.0 | 78.0 | 65.0 | 5.0 | 15.0 | 15.0 | 35.0 |
| 15 | 2.0 | 0 | 20.0 | 78.0 | 65.0 | 5.0 | 25.0 | 5.0 | 35.0 |
| 16* | 0.2 | 0 | 20.0 | 79.8 | 70.0 | 5.0 | 15.0 | 10.0 | 30.0 |
| 17* | 5.5 | 0 | 20.0 | 74.5 | 45.0 | 5.0 | 40.0 | 10.0 | 55.0 |
| 18* | 2.0 | 10.0 | 15.0 | 73.0 | 55.0 | 5.0 | 30.0 | 10.0 | 45.0 |
| 19* | 2.0 | 0 | 8.0 | 90.0 | 55.0 | 5.0 | 30.0 | 10.0 | 45.0 |

TABLE 1-continued

| | Glass | | | | | Filler | | | |
|---|---|---|---|---|---|---|---|---|---|
| | Composition (based on 100 of total weight of glass) | | | | | | | | Total |
| Sample No. | K$_2$O [% by weight] | Al$_2$O$_3$ [% by weight] | B$_2$O$_3$ [% by weight] | SiO$_2$ [% by weight] | Content [% by weight] | Alumina [% by weight] | Quartz [% by weight] | Ferrite [% by weight] | content [% by weight] |
| 20* | 2.0 | 0 | 28.0 | 70.0 | 55.0 | 5.0 | 30.0 | 10.0 | 45.0 |
| 21* | 4.0 | 3.0 | 25.0 | 68.0 | 55.0 | 5.0 | 30.0 | 10.0 | 45.0 |
| 22* | 2.0 | 0 | 10.0 | 88.0 | 55.0 | 5.0 | 30.0 | 10.0 | 45.0 |
| 23* | 2.0 | 0 | 20.0 | 78.0 | 25.0 | 5.0 | 60.0 | 10.0 | 75.0 |
| 24* | 2.0 | 0 | 20.0 | 78.0 | 85.0 | 2.0 | 3.0 | 10.0 | 15.0 |
| 25* | 2.0 | 0 | 20.0 | 78.0 | 65.0 | 5.0 | 13.0 | 17.0 | 35.0 |
| 26* | 2.0 | 0 | 20.0 | 78.0 | 65.0 | 5.0 | 27.0 | 3.0 | 35.0 |
| 27* | 2.0 | 0 | 20.0 | 78.0 | 68.0 | 5.0 | 27.0 | 0 | 32.0 |

In Table 1, the compositions of the samples marked with "*" are outside the ranges of preferred embodiments of the present invention.

The same solvent, binder, and plasticizer as described above were added to a calcined Ni—Zn—Cu-based ferrite powder and sufficiently mixed together to provide a slurry. The slurry was formed by a doctor blade method into ferrite sheets.

The glass ceramic sheets and the ferrite sheets were subjected to measurements and evaluations.

Pieces formed by cutting the glass ceramic sheet were stacked and pressure-bonded to form a pressure-bonded body having dimensions of about 50 mm×about 50 mm×about 0.6 mm. The pressure-bonded body was fired at about 900° C. for about 1 hour in air to form a ceramic substrate. The relative dielectric constant $\varepsilon_r$ of the ceramic substrate was measured by a cavity resonator method at a measurement frequency of about 3 GHz. Table 2 lists the relative dielectric constants of the samples. The evaluation criterion is $\varepsilon_r \leq 4.5$.

Figure 4A:
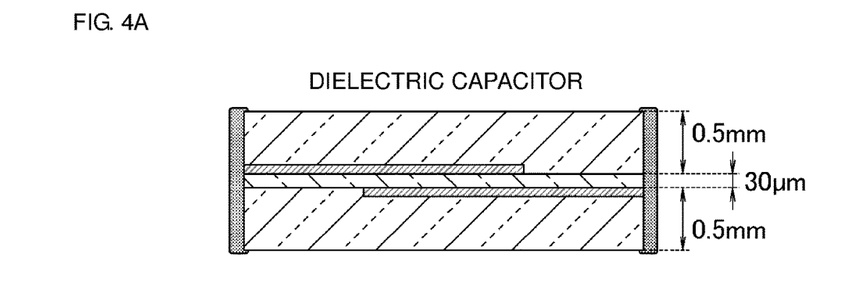
FIG. 4A is a sectional view taken in the thickness direction.
Figure 4B:
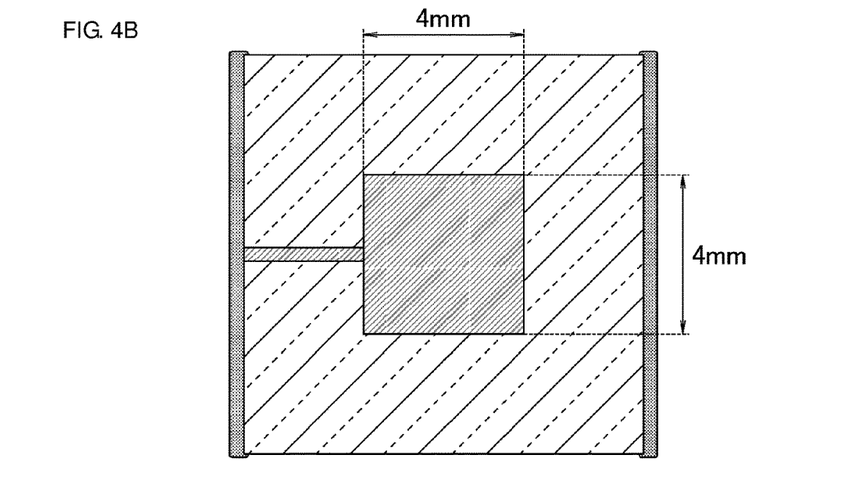
FIG. 4B is a sectional view taken along a plane through which one electrode extends.
Figure 4C:
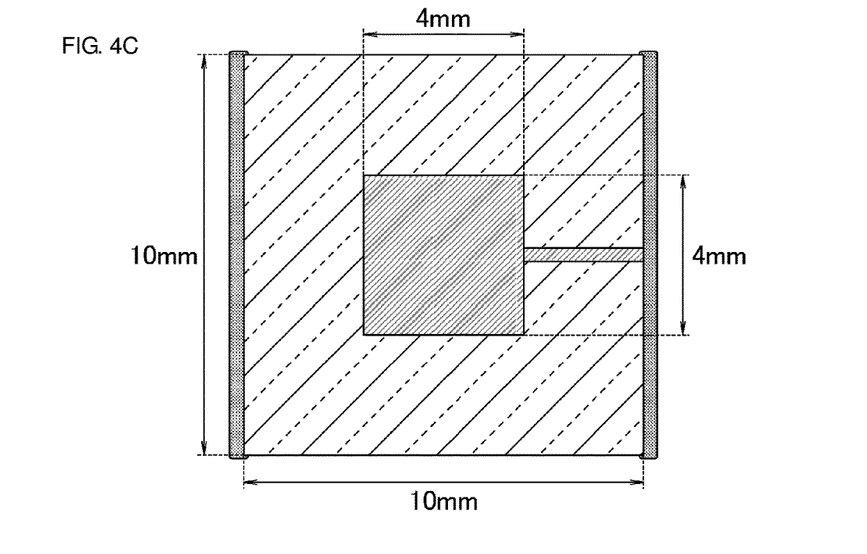
FIG. 4C is a sectional view taken along a plane through which the other electrode extends.

FIGS. 4A to 4C are schematic diagrams of a dielectric capacitor produced in examples of preferred embodiments of the present invention and comparative examples.

An Ag-based electrode paste was applied by printing to pieces formed by cutting the glass ceramic sheet. The resulting pieces were stacked and pressure-bonded so as to have a predetermined thickness, and then fired at about 900° C. for about 1 hour in air to form a dielectric capacitor having dimensions of about 10 mm×about 10 mm×about 1.0 mm (electrode area: about 4 mm×about 4 mm, interelectrode distance: about 30 μm).

Figure 5A:
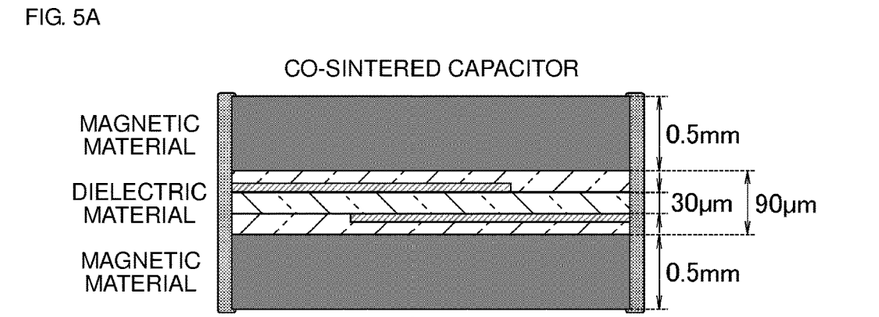
FIG. 5A is a sectional view taken in the thickness direction.
Figure 5B:
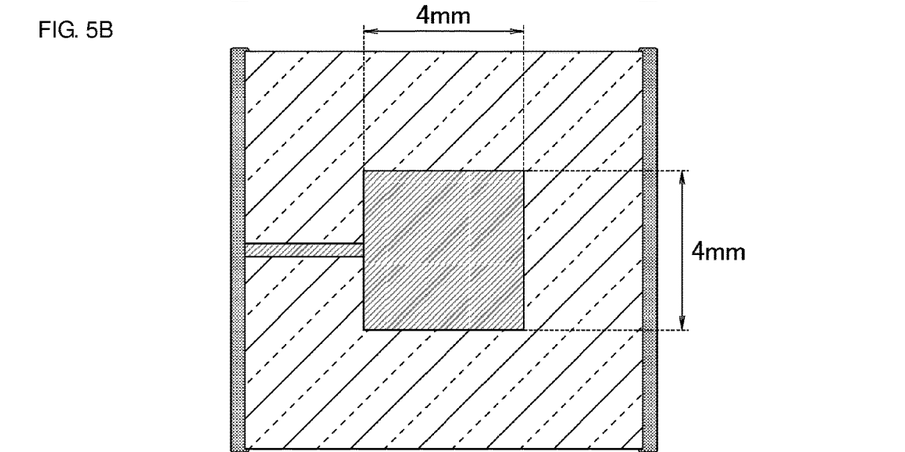
FIG. 5B is a sectional view taken along a plane through which one electrode extends.
Figure 5C:
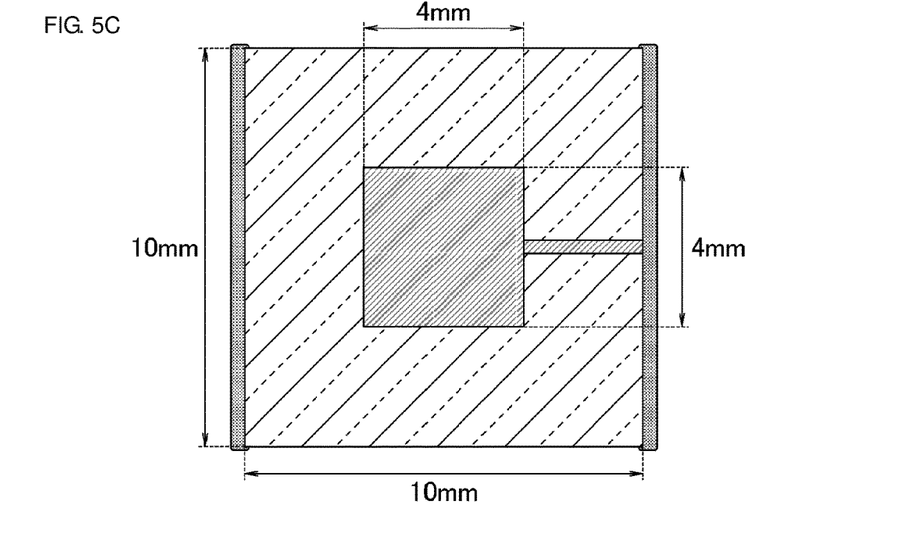
FIG. 5C is a sectional view taken along a plane through which the other electrode extends.

FIGS. 5A to 5C are schematic diagrams of a co-sintered capacitor produced in each of the examples of preferred embodiments of the present invention and the comparative examples.

A co-sintered capacitor including a composite of dielectric and magnetic materials was produced with a glass ceramic sheet and ferrite sheets. The composite having a structure in which the glass ceramic sheet having a thickness of about 90 μm after firing was arranged between the ferrite sheets each having a thickness of about 0.5 mm after firing was co-sintered at about 900° C. for about 1 hour in air to form a co-sintered capacitor in which a capacitor was formed only in the middle of the glass ceramic sheet, the co-fired capacitor having dimensions of about 10 mm×about 10 mm×about 1.0 mm (electrode area: about 4 mm×about 4 mm, interelectrode distance: about 30 μm).

The insulation resistance of each of the dielectric capacitor and the co-sintered capacitor was measured with an insulation resistance tester. Table 2 lists the insulation resistance (log IR) of each sample. The evaluation criterion is log IR>10.

Figure 6A:
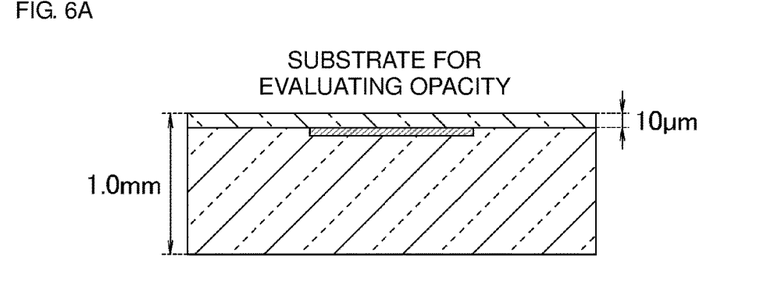
FIG. 6A is a sectional view taken in the thickness direction.
Figure 6B:
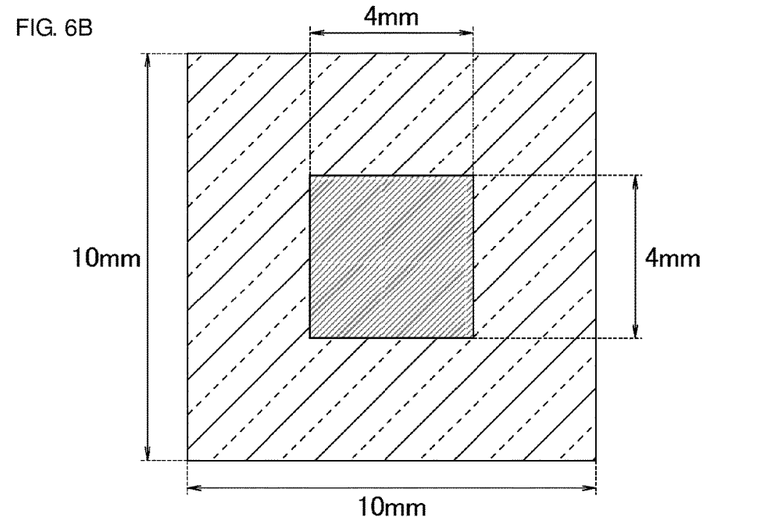
FIG. 6B is a sectional view taken a plane through which an electrode extends.

FIGS. 6A and 6B are schematic diagrams of a substrate for evaluating opacity, the substrate being produced in each of the examples of preferred embodiments of the present invention and the comparative examples.

An Ag-based electrode paste was applied by printing to pieces formed by cutting the glass ceramic sheet. The resulting pieces were stacked and pressure-bonded so as to have a predetermined thickness, and then fired at about 900° C. for about 1 hour in air to form a substrate including an inner electrode therein, the substrate having dimensions of about 10 mm×about 10 mm×about 1.0 mm (electrode area: about 4 mm×about 4 mm). The inner electrode was arranged at a position about 10 μm away from and below a surface layer.

The opacity was checked by visually observing the appearance of the resulting substrate and evaluated according to the following evaluation criteria: "x": the built-in inner electrode is seen; and "○": the built-in inner electrode is not seen. Table 2 lists the results of the samples.

Figure 7:
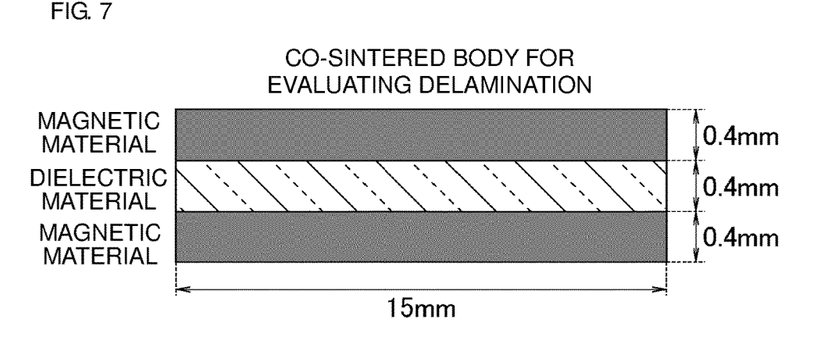
FIG. 7 is a schematic diagram of a co-sintered body for evaluating delamination, the co-sintered body being produced in each of the examples of preferred embodiments of the present invention and the comparative examples.

FIG. 7 is a schematic diagram of a co-sintered body for evaluating delamination, the co-sintered body being produced in each of the examples of preferred embodiments of the present invention and the comparative examples.

A co-sintered capacitor including a composite of dielectric and magnetic materials was produced with a glass ceramic sheet and ferrite sheets. The composite having a structure in which the glass ceramic sheet having a thickness of about 0.4 mm after firing was arranged between the ferrite sheets each having a thickness of about 0.4 mm after firing was co-sintered at about 900° C. for about 1 hour in air to form a co-sintered body having dimensions of about 15 mm×about 15 mm×about 1.2 mm.

The appearance of the resulting co-sintered body was observed with a metallographic microscope to check the presence or absence of, for example, delamination and cracking at the interfaces between the layers. Table 2 lists the results of the samples.

TABLE 2

| | Sample No. | Dielectric alone | | | Co-sintered body | |
| --- | --- | --- | --- | --- | --- | --- |
| | | $\varepsilon_r$ | logIR | Opacity | logIR | Delamination at interface |
| Example 1 | 1 | 4.31 | 11.8 | ○ | 11.8 | no |
| Example 2 | 2 | 4.28 | 11.1 | ○ | 10.9 | no |
| Example 3 | 3 | 4.29 | 10.9 | ○ | 10.7 | no |
| Example 4 | 4 | 4.29 | 11.7 | ○ | 11.7 | no |
| Example 5 | 5 | 4.31 | 11.0 | ○ | 11.0 | no |
| Example 6 | 6 | 4.28 | 10.7 | ○ | 10.5 | no |
| Example 7 | 7 | 4.28 | 11.1 | ○ | 11.1 | no |
| Example 8 | 8 | 4.31 | 11.0 | ○ | 10.9 | no |
| Example 9 | 9 | 4.42 | 11.4 | ○ | 11.4 | no |
| Example 10 | 10 | 4.18 | 11.1 | ○ | 10.9 | no |
| Example 11 | 11 | 4.23 | 10.5 | ○ | 10.5 | no |
| Example 12 | 12 | 4.34 | 11.8 | ○ | 11.5 | no |
| Example 13 | 13 | 4.29 | 11.3 | ○ | 11.3 | no |
| Example 14 | 14 | 4.47 | 11.3 | ○ | 11.3 | no |
| Example 15 | 15 | 4.17 | 11.5 | ○ | 11.5 | no |
| Comparative example 1 | 16* | unsintered | | ○ | — | yes |
| Comparative example 2 | 17* | 4.21 | 10.8 | ○ | 8.6 | no |
| Comparative example 3 | 18* | 4.25 | 11.9 | ○ | 9.5 | no |
| Comparative example 4 | 19* | unsintered | | ○ | — | yes |
| Comparative example 5 | 20* | 4.25 | 10.7 | ○ | 8.3 | no |
| Comparative example 6 | 21* | 4.25 | 10.9 | ○ | 8.9 | no |
| Comparative example 7 | 22* | unsintered | | ○ | — | yes |
| Comparative example 8 | 23* | unsintered | | ○ | — | yes |
| Comparative example 9 | 24* | 4.23 | 11.7 | ○ | 8.2 | no |
| Comparative example 10 | 25* | 4.53 | 11.1 | ○ | 11.1 | no |
| Comparative example 11 | 26* | 4.12 | 11.6 | X | 7.6 | no |
| Comparative example 12 | 27* | 4.05 | 11.6 | X | — | yes |

Figure 8:
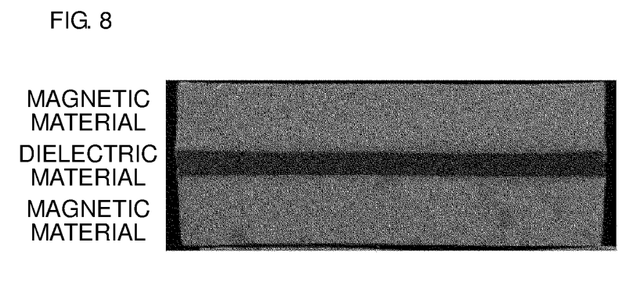
FIG. 8 is a photograph of the exterior of a co-sintered body produced from a sample having a composition within the range of a preferred embodiment of the present invention.

FIG. 8 is a photograph of the exterior of a co-sintered body produced from a sample having a composition within the range of preferred embodiments of the present invention. As with FIG. 7, the co-sintered body illustrated in FIG. 8 has a structure in which a dielectric material (glass ceramic layer) is arranged between two magnetic material pieces (ferrite layers). FIG. 8 indicates that delamination, cracking, and so forth do not occur.

As is clear from Table 2, each of the multilayer bodies (Examples 1 to 15) including the glass ceramic layer having a composition within the range according to preferred embodiments of the present invention and the ferrite layer satisfied all requirements: a low relative dielectric constant ($\varepsilon_r \leq$ about 4.5) of the glass ceramic layer, non-occurrence of delamination or the like at the interface, the co-sintered capacitor having insulation resistance (log IR> about 10) comparable to the dielectric capacitor, and low transparency of the glass ceramic layer.

In contrast, in Comparative example 1 in which the glass had a low $K_2O$ content, Comparative example 4 in which the glass had a low $B_2O_3$ content and a high $SiO_2$ content, Comparative example in which the glass had a high $SiO_2$ content, and Comparative example 8 in which the glass ceramic layer had a low glass content and a high filler content, the dielectric capacitor was not sintered.

In Comparative example 2 in which the glass had a high $K_2O$ content, Comparative example 3 in which the glass had a high $Al_2O_3$ content, Comparative example 5 in which the glass had a high $B_2O_3$ content, Comparative example 6 in which the glass had a low $SiO_2$ content, and Comparative example 9 in which the glass ceramic layer had a high glass content and a low filler content, the insulation resistance of the co-sintered capacitor was lower than the insulation resistance of the dielectric capacitor.

In Comparative example 10 in which the glass ceramic layer had a high ferrite content, the glass ceramic layer had a high relative dielectric constant.

In Comparative example 11 in which the glass ceramic layer had a low ferrite content, the glass ceramic layer had high transparency, and the insulation resistance of the co-sintered capacitor was lower than the insulation resistance of the dielectric capacitor. In Comparative example 12 in which the glass ceramic layer did not include a ferrite, the glass ceramic layer had high transparency, and delamination occurred at the interface.

Accordingly, the use of the multilayer bodies of preferred embodiments of the present invention will provide electronic components with good characteristics.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed:
1. A multilayer body comprising:
   a multilayer structure that includes a glass ceramic layer including a glass and a filler and a ferrite layer including a ferrite; wherein
   the glass ceramic layer has a glass content of about 30.0% or more by weight and about 80.0% or less by weight and a filler content of about 20.0% or more by weight and about 70.0% or less by weight;
   the glass included in the glass ceramic layer includes about 0.5% or more by weight and about 5.0% or less by weight $R_2O$, where R represents at least one selected from the group consisting of Li, Na, and K, about 0% or more by weight and about 5.0% or less by weight $Al_2O_3$, about 10.0% or more by weight and about 25.0% or less by weight $B_2O_3$, and about 70.0% or more by weight and about 85.0% or less by weight $SiO_2$ based on the total weight of the glass; and the filler included in the glass ceramic layer includes at least one of $SiO_2$ and $Al_2O_3$ and also includes about 5.0% or more by weight and about 15.0% or less by weight of a ferrite based on the total weight of the glass and the filler.

2. The multilayer body according to claim 1, wherein the ferrite included in the glass ceramic layer has a same composition as the ferrite included in the ferrite layer.

3. The multilayer body according to claim 1, wherein each of the ferrite included in the glass ceramic layer and the ferrite included in the ferrite layer is a Ni—Zn-based ferrite.

4. The multilayer body according to claim 1, wherein the multilayer body is a multilayer ceramic substrate.

5. The multilayer body according to claim 1, wherein the multilayer body is a chip component.

6. The multilayer body according to claim 1, wherein the glass ceramic layer is in contact with the ferrite layer.

7. The multilayer body according to claim 1, wherein the multilayer structure is a co-sintered body in which the glass ceramic layer and the ferrite layer are co-sintered.

8. The multilayer body according to claim 1, wherein the ferrite included in the ferrite layer is a ferromagnetic ferrite including a solid solution having a spinel structure.

9. The multilayer body according to claim 1, wherein the ferrite layer includes a filler other than the ferrite.

10. The multilayer body according to claim 9, wherein the ferrite layer has a ferrite content of about 95.0% or more by weight.

11. The multilayer body according to claim 1, wherein the filler included in the glass ceramic layer includes $SiO_2$ and $Al_2O_3$.

12. The multilayer body according to claim 11, wherein a $SiO_2$ content is about 5.0% or more by weight and about 60.0% or less by weight based on the total weight of the glass and the filler, and an $Al_2O_3$ content is about 0.5% or more by weight and about 10.0% or less by weight based on the total weight of the glass and the filler.

13. The multilayer body according to claim 12, wherein the $SiO_2$ content is about 20.0% or more by weight and about 40.0% or less by weight based on the total weight of the glass and the filler.

14. The multilayer body according to claim 4, wherein the multilayer ceramic substrate includes the ferrite layer and two of the glass ceramic layers that sandwich the ferrite layer therebetween in a thickness direction of the multilayer ceramic substrate.

15. The multilayer body according to claim 14, further comprising conductive leads provided in or on the glass ceramic layers.

16. The multilayer body according to claim 15, wherein the conductive leads include conductive films and via-hole conductors.

17. The multilayer body according to claim 15, wherein the conductive leads are primarily made of one of silver and copper.

18. The multilayer body according to claim 4, further comprising a coil conductor provided in the ferrite layer.

19. The multilayer body according to claim 18, wherein the coil conductor is primarily made of one of silver and copper.

20. An electronic component comprising the multilayer body according to claim 1.

* * * * *